(12) United States Patent
Connor et al.

(10) Patent No.: US 6,965,503 B2
(45) Date of Patent: Nov. 15, 2005

(54) ELECTRO-STATIC DISCHARGE PROTECTION CIRCUIT

(75) Inventors: John Connor, Burlington, VT (US); Robert J. Gauthier, Jr., Hinesburg, VT (US); Christopher S. Putnam, Hinesburg, VT (US); Alan L. Roberts, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,441

(22) Filed: Sep. 30, 2003

(65) Prior Publication Data

US 2005/0068702 A1   Mar. 31, 2005

(51) Int. Cl.[7] ............................................. H02H 9/00
(52) U.S. Cl. .......................................................... 361/56
(58) Field of Search ........................ 361/56, 111, 119, 361/91.1

(56) References Cited

U.S. PATENT DOCUMENTS

| | | | |
|---|---|---|---|
| 5,559,659 A | * | 9/1996 | Strauss ........................ 361/56 |
| 6,434,061 B1 | * | 8/2002 | Huber ......................... 365/194 |
| 6,552,886 B1 | * | 4/2003 | Wu et al. ..................... 361/56 |

* cited by examiner

*Primary Examiner*—Ronald Leja
(74) *Attorney, Agent, or Firm*—Downs Rachlin Martin PLLC

(57) ABSTRACT

An ESD protection circuit including the following: one or more inverters (I1, I2, I3), each of the one or more inverters having an input and an output; an RC network (11) having an output node (RCT), output node (RCT) connected with the input of at least one of said one or more inverters; a clamping device (N3) joined with the output of at least one of one or more inverters (I1, I2, I3); and a feedback device (NKP) in communication with clamping device (N3) and output node (RCT) of RC network (11). An RC network may include one or more resistors, and one or more decoupling capacitors. In one embodiment, feedback device (NKP) is an NFET and each of one or more inverters (I1, I2, I3) includes a PFET and NFET pair (P0/N0, P1/N1, P2/N2).

19 Claims, 6 Drawing Sheets

ELECTRO-STATIC DISCHARGE PROTECTION CIRCUIT

BACKGROUND OF INVENTION

1. Field of the Invention

The present invention relates generally to integrated circuit (IC) design, and more particularly to an electro-static discharge (ESD) protection circuit having a resistive/capacitive (RC) triggered ESD clamp capable of extended clamp-on times.

2. Background of the Invention

Semiconductor devices in ICs are known to be susceptible to damage from an ESD event. An ESD event may cause extremely high currents to flow through CMOS devices. As a result, the device junctions, gate oxides, and other adjacent structures may be permanently damaged.

Because of aggressive scaling of IC dimensions in advanced sub-micron technologies, protecting ICs from damage during ESD events is receiving a renewed focus. As IC technology scales or becomes smaller, device channel lengths and snapback voltage are reduced. When the drain to source voltage reaches certain levels, a device may enter the destructive snapback region. As a result, scaling of ICs increases the susceptibility of the IC devices to damage from ESD events. At the same time, scaled ICs are required to maintain the same level of ESD robustness as prior generations of IC technologies.

In the prior art, standard RC-triggered ESD clamps have been used for providing an ESD discharge path between power supplies and ground. During a typical IC"s power-up operation, it is desired that the IC"s ESD clamp(s) remain off. In order for this to occur, the ESD clamp"s RC network needs to charge at the same rate as the IC"s power-up ramp. That is, the RC network requires a small RC time constant (i.e., hundreds of nanoseconds to tens of microseconds) relative to the IC"s power-up ramp (i.e., typically hundreds of microseconds to tens of milliseconds).

However, during an ESD event, a current spike with a fast rise time of less than 10 ns may occur. During the ESD event, it is desired that the ESD clamp turn on and remain on during the high current portion of the ESD event, i.e., 500 ns or more. As a result, an RC time constant of approximately 500 ns or more is required depending on the level of ESD protection required. For example, for an IC power-up ramp rate in the tens of milliseconds and an ESD robustness target of 3 kV, an RC time constant of 500 ns is preferred.

Determination of the proper RC time constant becomes more difficult as the rise time of powering up an IC, i.e., 500 ns to tens of micro seconds, approaches the rise time of an ESD event, i.e., 10 ns. If the RC time constant is too large, the ESD clamp works well during the ESD event but allows too much leakage through the clamp(s) during power-up. Clamp leakage slows the IC power-up and may have adverse effects on "power on reset" circuitry possibly causing logic to initialize to the wrong state. Conversely, if the RC time constant is too small, there is little power-up leakage but the ESD clamp may shut off too soon during an ESD event potentially resulting in damage to the IC devices.

As illustrated in FIG. 1, one prior art circuit 2 employs a "diode connected" NFET as a resistor to the capacitance of the IC"s ESD clamp circuitry. Such a design typically allows too much clamp leakage because the PFET of the first inverter initially conducts more current than the diode connected NFET. As a result, the RC network charges too slowly and the IC power-up is slowed.

As illustrated in FIG. 2, in a second prior art circuit 4, a diode connected NFET is placed between the power rail and the source of the first PFET in the IC"s ESD clamp circuitry. In such a design, the first inverter in the ESD clamp circuit initially charges high slower than the output of the second inverter. As a result, the clamp may remain off in the initial stages of an ESD event thereby providing no protection to the IC. In addition, in such a design, since the switch point of the first inverter is reduced by the diode connected NFET, the node leading to the first inverter does not have to charge as high to flip the output of the first inverter. Thus, the clamp may not stay on for an extended length of time.

A third prior art circuit (not shown) utilizes a large resistance, i.e., 1 M ohm, between the output of the first inverter and ground. Although effective, such a design is difficult to use in increasing scaled IC designs because the large resistance requires a large amount of IC area.

SUMMARY OF INVENTION

One aspect of the present invention is an ESD protection circuit including the following: one or more inverters, each of the one or more inverters having an input and an output; a timing element for triggering the one or more inverters, the timing element having an output node, the output node connected with the input of at least one of the one or more inverters; a clamping device joined with the output of at least one of the one or more inverters; and a feedback device for preventing the clamping device from turning off until completion of a high current portion of an ESD event, the feedback device in communication with the clamping device and the output node of the timing element.

Another aspect of the present invention is an ESD protection circuit including the following: one or more inverters, each of the one or more inverters having an input and an output; an RC network having an output node, the output node connected with the input of at least one of the one or more inverters; a clamping device joined with the output of at least one of the one or more inverters; and a feedback device in communication with the clamping device and the output node of said RC network.

Still another aspect of the invention is an ESD protection circuit including the following: one or more inverters, each of the one or more inverters having an input and an output; a clamping device joined with the output of at least one of the one or more inverters; means for timing the triggering of each of the one or more inverters; and means for extending the time the clamping device is on, wherein the clamping device remains on until a high current portion of an ESD event terminates.

Other features, utilities and advantages of various embodiments of the invention will be apparent from the following more particular description of embodiments of the invention as illustrated in the accompanying drawings.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 1:
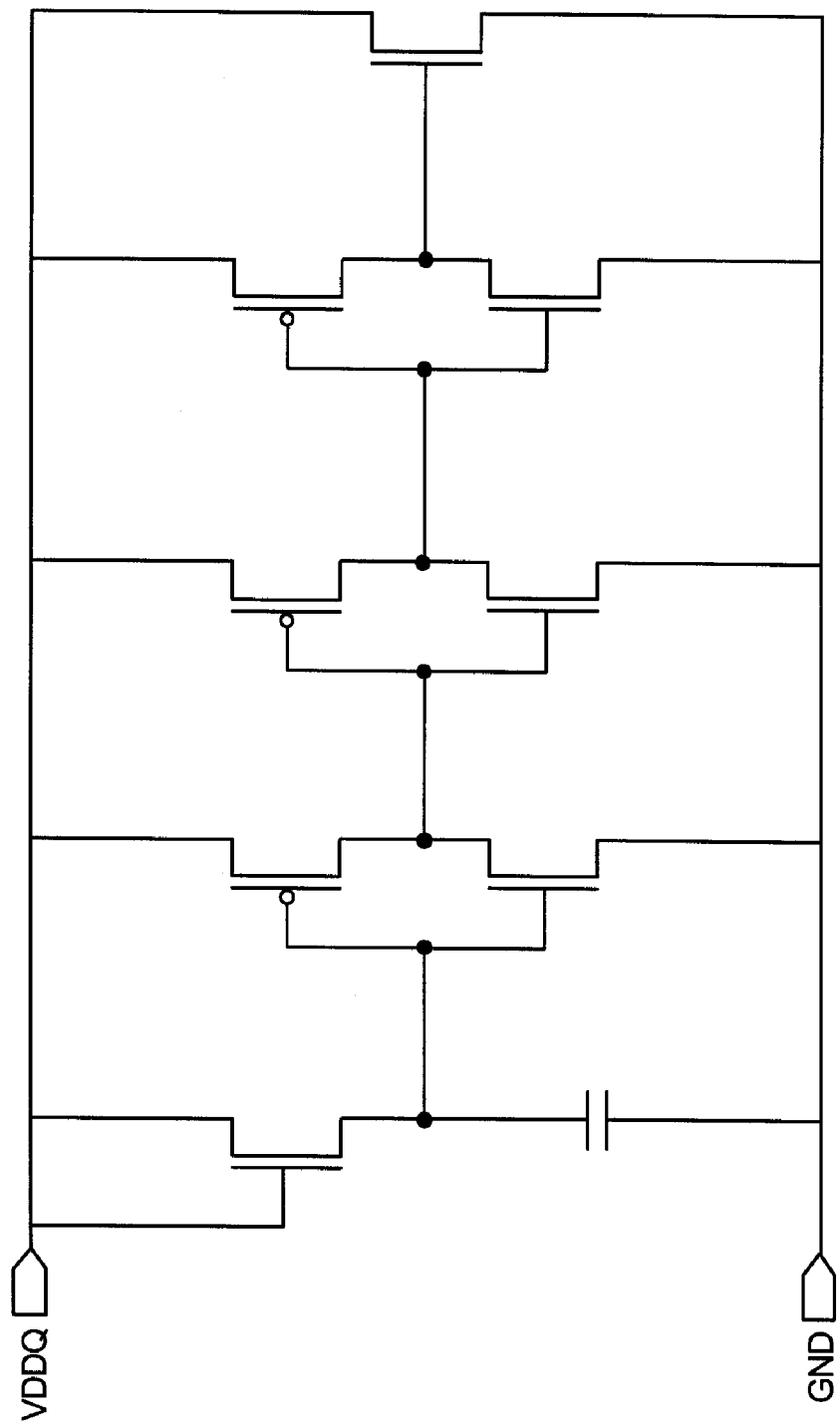
FIG. 1 is a prior art electrical schematic diagram of an RC-triggered ESD clamp circuit using a diode connected NFET as a resistance to the capacitance.
Figure 2:
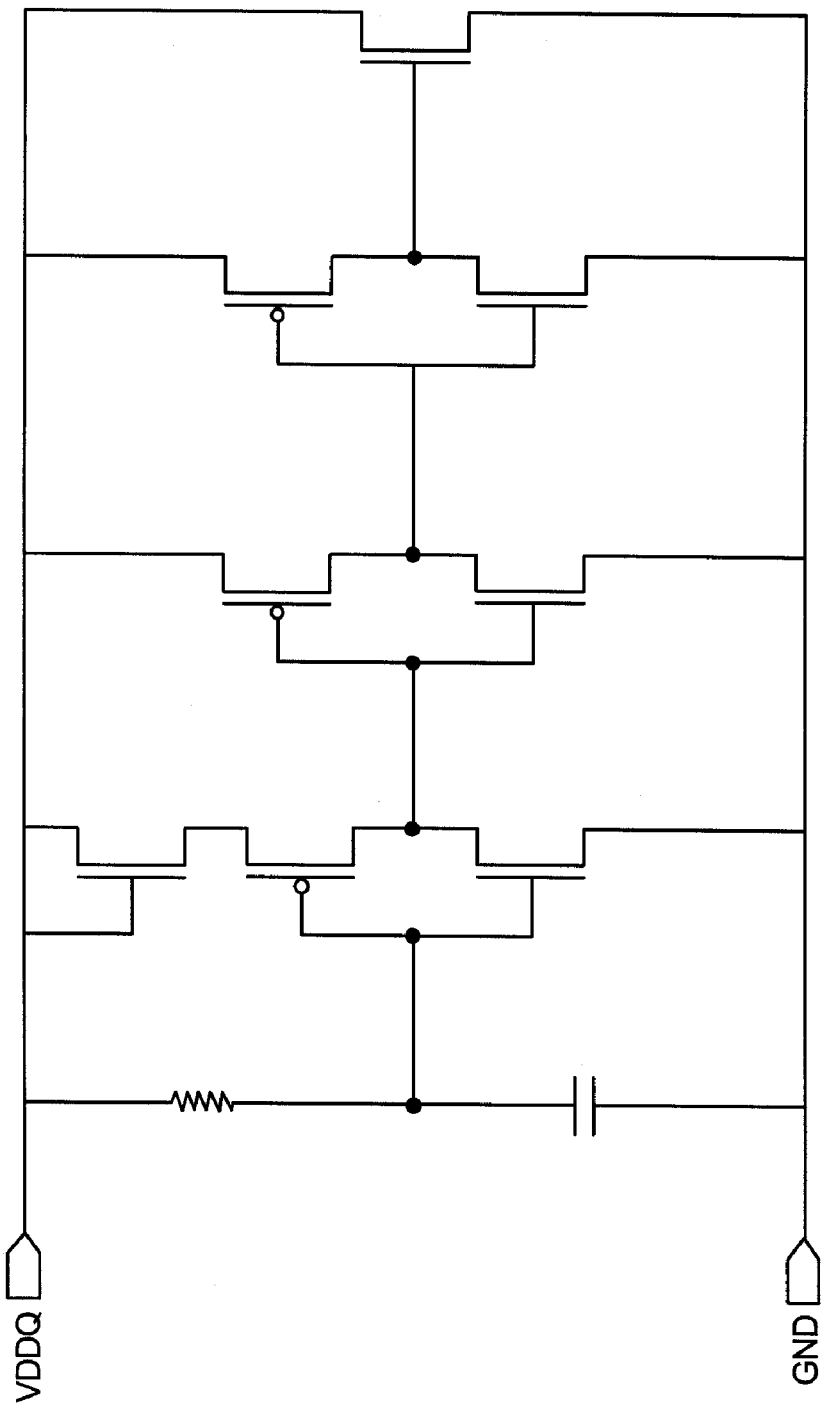
FIG. 2 is a prior art electrical schematic diagram of an RC-triggered ESD clamp circuit utilizing a diode connected NFET in series with the PFET of the first inverter.
Figure 3:
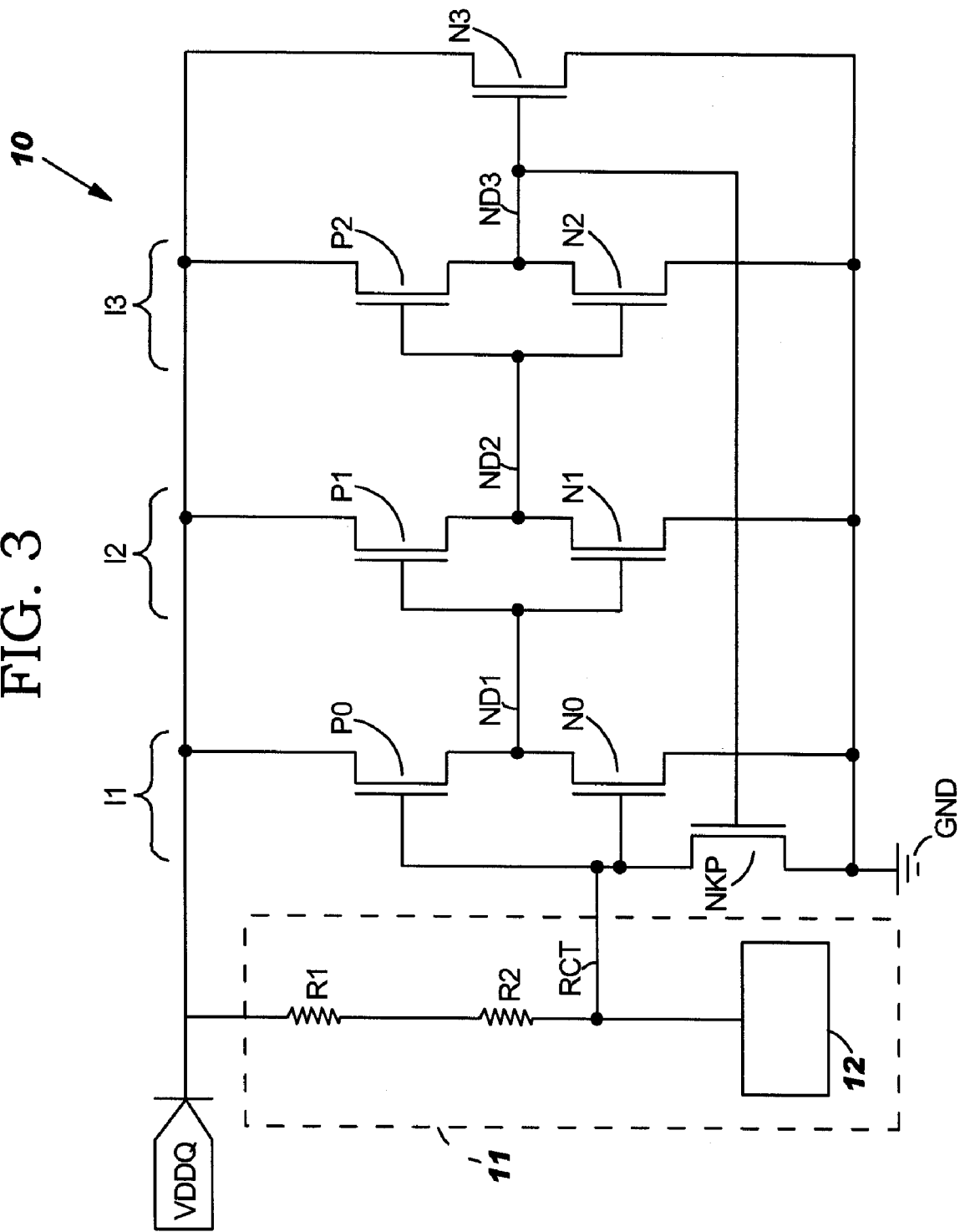
FIG. 3 is an electrical schematic diagram of an RC-triggered ESD clamp circuit according to one embodiment of the present invention.

The present invention is directed to an ESD protection circuit. The present invention includes an RC-triggered ESD clamp capable of extended clamp-on times. An example of the disclosed invention is depicted in FIG. 3, although it should be understood that the present invention is not limited to this (or any other) particular embodiment, but rather is intended to cover any protection circuits that fairly fall within the broad scope of the appended claims. In the drawings, like elements include like element numbers.

FIG. 3 illustrates an ESD protection circuit 10 (also referred to as ESD circuit 10) according to one embodiment of the present invention. ESD circuit 10 includes an RC network 11 (also referred to as RC 11) having buried resistors R1 and R2, which provide the network's resistive element and decoupling capacitors 12 that make up the network's capacitive element. ESD circuit 10 also includes inverters I1, I2, and I3, each formed by a respective PFET and NFET device pair, i.e., P0/N0, P1/N1, and P2/N2. ESD circuit 10 further includes a large clamp device N3 and a feedback NFET NKP. As one skilled in the art understands, the large clamp device and feedback device may include multiple transistors.

In one embodiment, R1 and R2 each have a resistance of approximately 2.3 k ohms and decoupling capacitors 12 each have a capacitance of approximately 75 pF and are designed according to manufacturing layout rules that minimize the likelihood of oxide defects. In the embodiment illustrated in FIG. 3, each of decoupling capacitors 12 requires a wafer area of approximately 4.9 $\mu m \times 2.4$ $\mu m$. In FIG. 3, a 10×7 array of decoupling capacitors 12 is utilized thereby requiring a wafer area of 49.2 $\mu m \times 16.55$ $\mu m$ to achieve a capacitance of approximately 5.25 pF. In one embodiment, inverter I1 utilizes a high switch point, i.e., a 10/2 device width ratio. In one embodiment, large clamp device N3 is sized to conduct approximately 2 amps (peak Human Body Model (HBM) current for a 3 kV ESD event) at Vgs=Vds=2V, which is less than the technology snapback voltage. The values of R1 plus R2 (4.6 k ohms) and decoupling capacitors 12 (5.25 pF) yield an RC time constant of approximately 25 ns as opposed to the typically required 500 ns RC time constant discussed above. This relatively small RC time constant allows the disclosed circuit to be used in "fast" power-up ramp rate applications as well as typical and slow applications.

ESD circuit 10 includes a plurality of nodes that join the circuit devices. A node RCT connects R2 and decoupling capacitors 12 to inverter I1, i.e., the gates of P0 and N0. A node ND1 connects the output of inverter I1, i.e., the drains of P0 and N0, to inverter I2, i.e., the gates of P1 and N1. A node ND2 connects the output of inverter I2, i.e., the drains of P1 and N1, to inverter I3, i.e., the gates of P2 and N2. A node ND3 connects the output of inverter I3, i.e., the drains of P2 and N2, to the gate of NFET N3.

Figure 4:
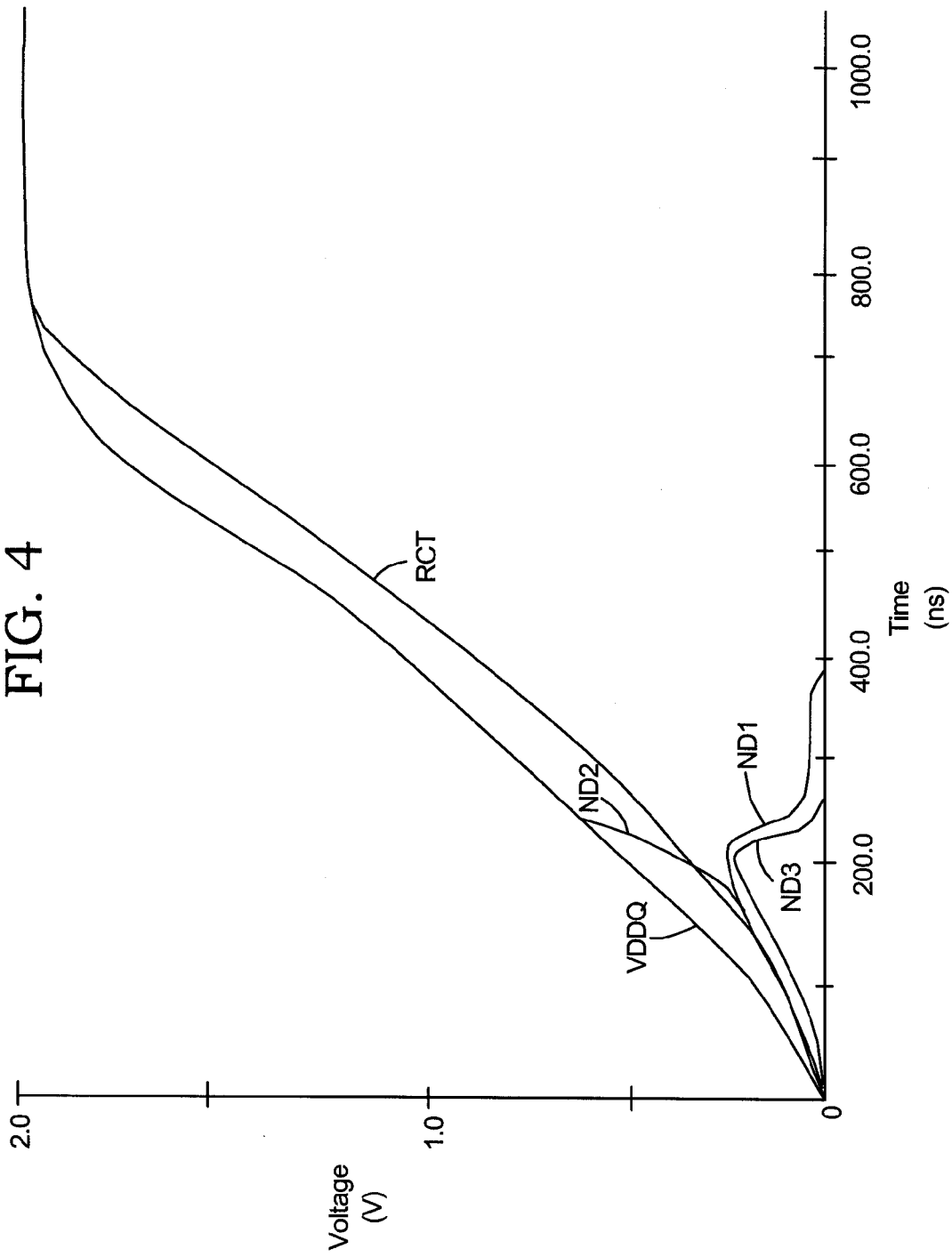
FIG. 4 is a plot of the normal power-up voltage over time of an RC-triggered ESD clamp circuit according to one embodiment of the present invention.

FIG. 4 illustrates a fast power-up ramp rate of a power rail (VDDQ) of ESD circuit 10 to 1.8V, i.e., in 700 ns. Power is introduced to ESD circuit 10 via power rail VDDQ. Before power is applied to ESD circuit 10, nodes RCT, ND1, ND2, and ND3 are at virtual ground (GND). All of the PFETS have a Vgs equal to a threshold value, i.e., approximately 0.3V in one embodiment, before conducting significant current. As a result, with the exception of sub-threshold leakage, as the power supply begins to ramp-up (between VDDQ=0V to 0.2V), all of the PFETS are essentially off. However, because resistors R1 and R2 of RC 11 do not have a threshold voltage, they begin conducting current as soon as VDDQ starts to rise. Consequently, node RCT starts to charge while nodes ND1, ND2, and ND3 only rise due to PFET sub-threshold leakage.

Other measures may also be taken to ensure that node RCT charges at a faster rate than nodes ND1, ND2, and ND3 during the power rail's initial ramp-up. The channel lengths of PFETs P0, P1, and P2 may be increased over standard lengths to reduce the amount of current they can conduct during the initial power ramp-up. Also, dummy loads, i.e., extra devices, with their gates connected to node ND1 and their drain and source nodes connected to the same potential, may be added to node ND1 to make the RC time constant of node ND1 greater than the RC time constant of node RCT during the initial stages of a power-up event. As a result, in one embodiment, node RCT charges at approximately the same rate as the power rail.

Because node RCT and thus the gate voltage of inverter I1 is rising and closely tracking VDDQ, i.e., with approximately 0.05V difference, PFET P0's Vgs stays relatively small thereby preventing P0 from conducting significant current. This allows the disclosed circuit to be used in fast power-up ramp rate applications as well as typical and slow applications. Node RCT charging high causes NFET N0's Vgs to increase thereby allowing it to pull down node ND1 once node RCT reaches the NFET's threshold voltage, i.e., 0.3V in one embodiment. In turn, the Vgs of P1 increases and P1 conducts current. Still referring to FIG. 4, as a result, node ND2 is charged and continues to be charged at approximately the same rate as VDDQ. As follows, PFET P2 is kept off and NFET N2 is turned on. NFET N2 keeps node N3 at GND thereby keeping the clamp off and avoiding significant clamp leakage.

In contrast to a normal power-up, it is desired that the clamp device, i.e., N3, remain on until completion of a significant ESD event. Otherwise, the power rail may rise too high and too much Vds stress may be put across an IC's devices thereby resulting in possible destructive device snapback. In one particular embodiment, NFET NKP prevents node RCT from charging high enough to reach the switch point of inverter I1 until the rail potential has fallen from the clamped voltage of approximately 2.0V to approximately 1.0V at approximately 500 ns into the ESD event. Once the ESD energy has dissipated across the IC, the voltage rail value begins to drop thereby causing the Vgs of NFET NKP to fall. This "feedback" to the gate of NFET NKP results in node RCT charging higher as the rail potential falls. After approximately 500 ns, node RCT causes inverter I1 and thus inverters I2 and I3 to switch states. As a result, clamp device N3 and NFET NKP turn off. In one embodiment of the present invention, the use of a high switch point, i.e., a 10/2 device width ratio, for inverter I1 causes node RCT to have to charge higher to switch the output of inverter I1. As a result, clamp device N3 stays on longer during an ESD event than if a conventional device width ratio, i.e., 2/1, was used.

Figure 5:
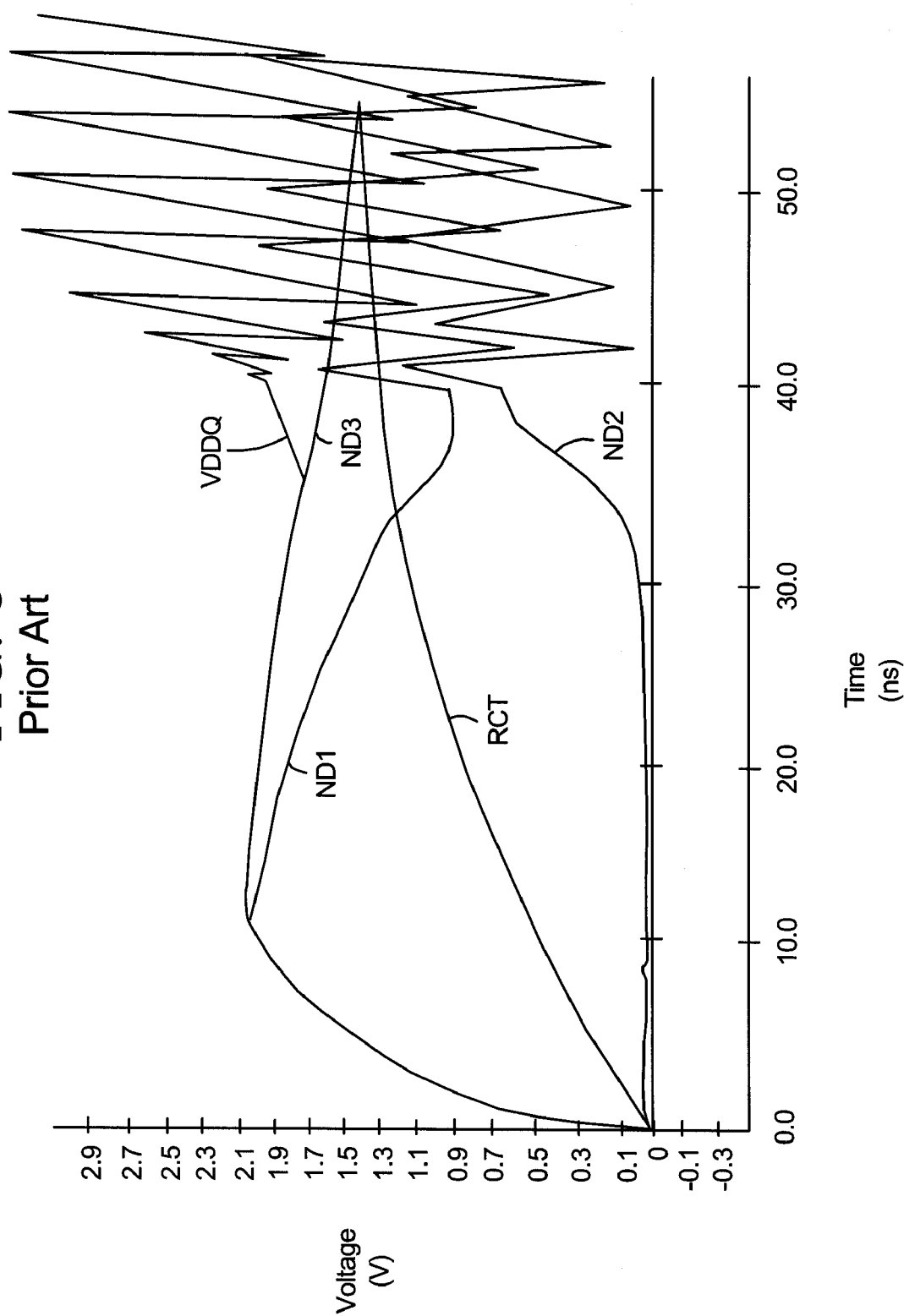
FIG. 5 is a plot of the response of a prior art RC-triggered ESD clamp circuit during an ESD event.

FIG. 5 illustrates an ESD event using a prior art IC that does not include a feedback scheme as described above with respect to NFET NKP. Without the feedback scheme, clamp device N3 shuts off too soon as Vpeak, i.e., VDDQ peaking at approximately 3.0V is greater than the technology"s Vsnapback of approximately 2.5V. Node RCT rises at a rate that causes inverter I1 to switch and thus clamp device N3 to shut off in less than 50 ns.

Figure 6:
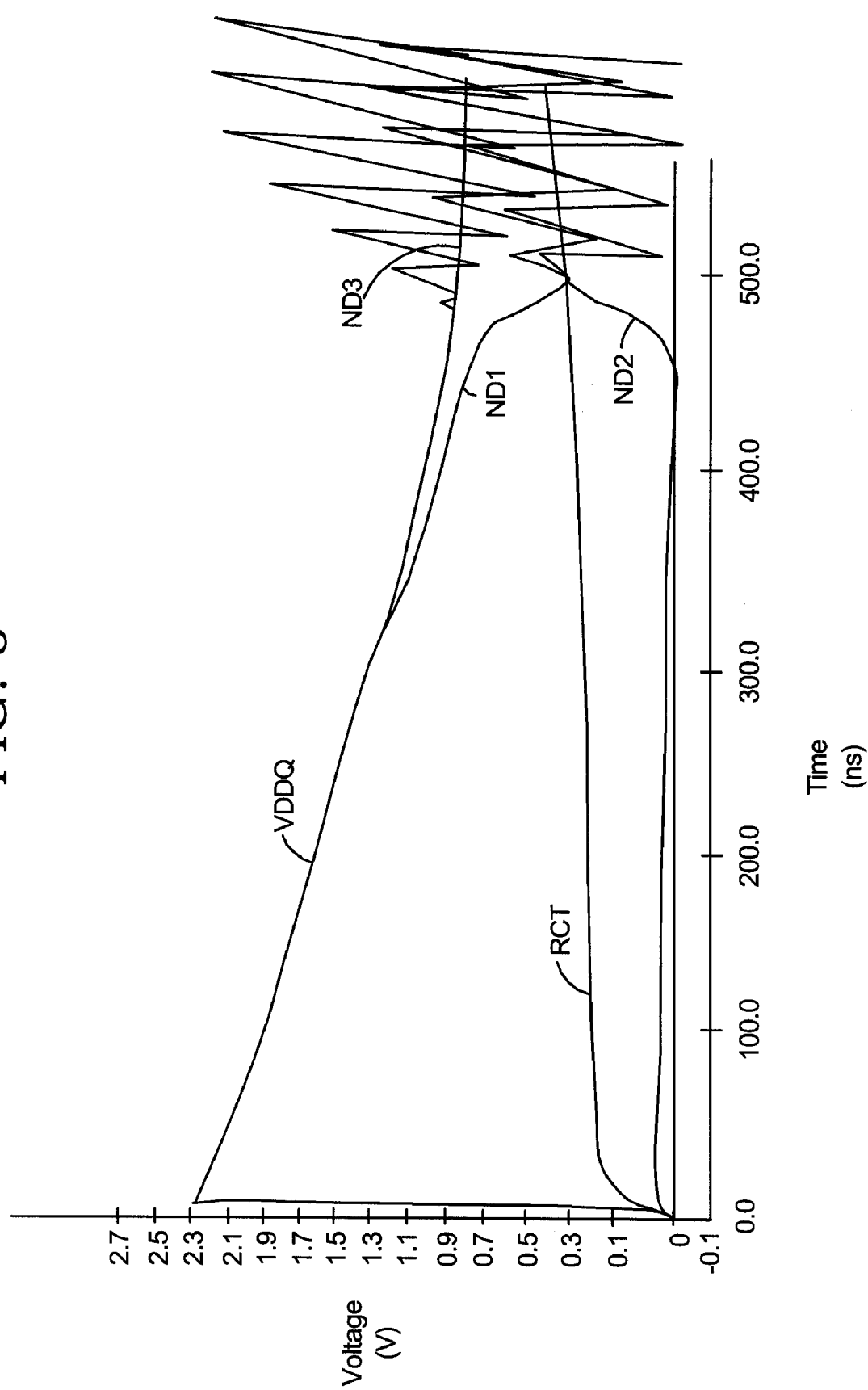
FIG. 6 is a plot of the response of an RC-triggered ESD clamp circuit according to one embodiment of the present invention during an ESD event.

In contrast, FIG. 6 illustrates an IC according to the present invention that includes a feedback NFET. As mentioned above, NFET NKP prevents node RCT from charging high enough to reach the switch point of inverter I1 until the rail potential is approximately 1.0V. As a result, clamp device N3 remains on longer, i.e., approximately 500 ns in one embodiment, thereby protecting the IC from ESD damage longer. In this way, RC I1 serves as a timing element with respect to the control of inverter I1.

An RC-triggered ESD clamp circuit according to the present invention provides a high failure threshold, a small layout area, and a low RC delay. Such a design may be used in fast power-up ramp rate applications and are effective for IC designs where a high capacitance, low impedance path does not exist between power supplies and ground.

One embodiment of the present invention includes a circuit that utilizes feedback to an NFET in combination with a small RC time constant to provide an RC-triggered ESD clamp between the IC power rail VDDQ and GND that can be used in a fast power-up ramp rate application and is area efficient. The NFET prevents the RCT node from charging-up too fast and thus from turning the ESD clamp off too soon during an ESD event. The use of smaller resistive and capacitance elements provides for an area efficient solution and allows the clamp to be used with fast power-up ramp rates.

One prior art implementation, i.e., without a mechanism to extend clamp on time, requires a 500 ns RC time constant. For a resistance of 4600 ohms, the capacitance required in the prior art implementation is 108.7 pF. As follows, this amount of capacitance requires approximately 1450 dcap instances, a 20.7× increase over an implementation according to the present invention. Further, if a 10×Y array were maintained, the prior art capacitor array area, i.e., 10×145, would be 49.2 $\mu$m×348 $\mu$m, a 21× increase.

The small RC time constant used in one embodiment of the present invention allows the ESD protection circuit to be used in fast power up ramp rates applications. In addition, a small RC time constants allows area efficient ESD clamp design due to smaller R and C. As a result, this topology can be used in area constrain chip designs or more ESD clamps can be placed on a given chip due to the area efficient design. For example, in at least one embodiment, one copy of the disclosed ESD clamp is located at every chip signal pad due to the small chip area consumed.

In one embodiment according to the present invention, a buried resistor array of 1×2 with instance dimensions of 34 $\mu$m×0.875 $\mu$m is used. For equivalent capacitances, the resistance value required to obtain a 500 ns time constant in a prior art implementation is 95.238 k ohms with approximately 41 resistance instances. Therefore, the present invention offers area efficiencies over the prior art.

While the present invention has been described in connection with specified embodiments, it will be understood that it is not so limited. On the contrary, it is intended to cover all alternatives, modifications and equivalents as may be included within the spirit and scope of the invention as defined in the appended claims.

What is claimed is:

1. An ESD protection circuit comprising:
   an odd number of inverters, each of said odd number of inverters having an input and an output;
   a timing element for triggering said odd number of inverters, said timing element having an output node, said output node connected with said input of at least one of said odd number of inverters;
   a clamping device joined with said output of at least one of said odd number of inverters; and
   a feedback device for preventing said clamping device from turning off until completion of a high current portion of an ESD event, said feedback device in communication with said clamping device and said output node of said timing element.

2. An ESD protection circuit according to claim 1, wherein said feedback device prevents said clamping device from turning off for at least the first 500 ns of the ESD event.

3. An ESD protection circuit according to claim 1, wherein said timing element is an RC network.

4. An ESD protection circuit according to claim 3, wherein said RC network includes one or more resistors, and one or more decoupling capacitors.

5. An ESD protection circuit according to claim 1, wherein said feedback device is an NFET.

6. An ESD protection circuit according to claim 1, wherein each of said odd number of inverters includes a PFET and an NFET.

7. An ESD protection circuit according to claim 1, wherein said odd number of inverters comprises at least three inverters.

8. An ESD protection circuit comprising:
   an odd number of inverters, each of said odd number of inverters having an input and an output;
   an RC network having an output node, said output node connected with said input of at least one of said odd number of inverters;
   a clamping device joined with said output of at least one of said odd number of inverters; and
   a feedback device in communication with said clamping device and said output node of said RC network.

9. An ESD protection circuit according to claim 8, wherein said RC network includes one or more resistors, and one or more decoupling capacitors.

10. An ESD protection circuit according to claim 8, wherein said feedback device is an NFET.

11. An ESD protection circuit according to claim 8, wherein each of said odd number of inverters includes a PFET and an NFET.

12. An ESD protection circuit according to claim 8, wherein said odd number of inverters comprises at least three inverters.

13. An ESD protection circuit comprising:
   an odd number of inverters, each of said odd number of inverters having an input and an output;
   a clamping device joined with said output of at least one of said odd number of inverters;
   means for timing the triggering of each of said odd number of inverters, said means for timing having an output node connected with said input of at least one of said odd number of inverters; and
   means for extending the time said clamping device is on, said means for extending being in communication with said clamping device and said output node of said means for timing,
   wherein said clamping device remains on until a high current portion of an ESD event terminates.

14. An ESD protection circuit according to claim 13, wherein said means for timing is an RC network.

15. An ESD protection circuit according to claim 14, wherein said RC network includes one or more resistors, and one or more decoupling capacitors.

16. An ESD protection circuit according to claim 13, wherein said means for extending includes a feedback device for preventing said clamping device from turning off for at least the first 500 ns of the ESD event.

17. An ESD protection circuit according to claim 13, wherein said means for extending includes an NFET.

18. An ESD protection circuit according to claim 13, wherein each of said odd number of inverters includes a PFET and an NFET.

19. An ESD protection circuit according to claim 13, wherein said odd number of inverters comprises at least three inverters.

* * * * *